(12) United States Patent
Marellapudi et al.

(10) Patent No.: US 12,375,004 B2
(45) Date of Patent: Jul. 29, 2025

(54) SYNCHRONOUS REVERSE BLOCKING SWITCH FOR SOFT-SWITCHING CURRENT SOURCE CONVERTERS AND SOFT-SWITCHING CURRENT SOURCE CONVERTERS INCLUDING THE SAME

(71) Applicant: Georgia Tech Research Corporation, Atlanta, GA (US)

(72) Inventors: Aniruddh Marellapudi, Atlanta, GA (US); Mickael J. Mauger, Atlanta, GA (US); Rajendra Prasad Kandula, Atlanta, GA (US); Deepakraj M. Divan, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 247 days.

(21) Appl. No.: 18/011,061

(22) PCT Filed: Jun. 21, 2021

(86) PCT No.: PCT/US2021/038232
§ 371 (c)(1),
(2) Date: Dec. 16, 2022

(87) PCT Pub. No.: WO2021/258046
PCT Pub. Date: Dec. 23, 2021

(65) Prior Publication Data
US 2023/0336088 A1 Oct. 19, 2023

Related U.S. Application Data

(60) Provisional application No. 63/041,632, filed on Jun. 19, 2020.

(51) Int. Cl.
*H02M 3/335* (2006.01)
*H02M 1/00* (2006.01)
*H02M 1/32* (2007.01)

(52) U.S. Cl.
CPC ..... *H02M 3/33592* (2013.01); *H02M 1/0058* (2021.05); *H02M 1/32* (2013.01)

(58) Field of Classification Search
CPC ... H02M 3/33592; H02M 1/0058; H02M 1/32
(Continued)

(56) References Cited

U.S. PATENT DOCUMENTS 5,307,005 A 4/1994 Ahladas et al.
2004/0120090 A1* 6/2004 Galli ................. H02M 3/3376
361/115
(Continued)

FOREIGN PATENT DOCUMENTS

JP 2002-345259 A 11/2002
JP 2008-193839 A 8/2008
(Continued)

OTHER PUBLICATIONS

Soft-Switching High-Frequency AC-Link Universal Power Converters With Galvanic Isolation. by Mahshid Amirabadi (Year: 2013).*
Extended European Search Report from Application No. 21825653.5 dated May 15, 2024.
Torres, et al., "Operation and Analysis of Current-Source Inverters using Dual-Gate Four-Quadrant Wide-Bandgap Power Switches",
(Continued)

*Primary Examiner* — Yemane Mehari
(74) *Attorney, Agent, or Firm* — Troutman Pepper Locke LLP; Ryan A. Schneider

(57) ABSTRACT

A synchronous reverse blocking switch for a soft-switching current source converter (SSCSC), the switch comprising: a first controlled switch; a second controlled switch connected in series to the first controlled switch; and a delay generation circuit configured to control: the second controlled switch to turn on after a delay (t_dON) from the first controlled switch turning on, and the second controlled switch to turn off after a delay (t_dOFF) from the first controlled switch turning off.

21 Claims, 13 Drawing Sheets

(58) Field of Classification Search
USPC .................................................... 363/21.14
See application file for complete search history.

(56) References Cited

U.S. PATENT DOCUMENTS

| | | | | |
|---|---|---|---|---|
| 2008/0150604 | A1* | 6/2008 | Huber | H02M 1/08 327/290 |
| 2011/0292705 | A1* | 12/2011 | Fornage | H02M 7/537 323/318 |
| 2012/0307531 | A1 | 12/2012 | Toliyat et al. | |
| 2014/0027785 | A1* | 1/2014 | Rose | H03K 17/08122 257/77 |
| 2021/0273574 | A1* | 9/2021 | Zheng | H02M 1/44 |

FOREIGN PATENT DOCUMENTS

| | | |
|---|---|---|
| JP | 2014-027795 A | 2/2014 |
| WO | 2020/023471 A1 | 1/2020 |

OTHER PUBLICATIONS

2019 IEEE Energy Conversion Congress and Exposition (ECCE), IEEE, Sep. 29, 2019, pp. 2353-2360.

Wang, et al., "An Isolated 1-16 Bidirectional Single-Stage DC-AC Converter Using Wide-Band-Gap Devices With a Novel Carrier-Based Unipolar Modulation Technique Under Synchronous Rectification," IEEE Transactions on Power Electronics, Institute of Electrical and Electronics Engineers, USA, vol. 32, No. 3, Mar. 1, 2017 (Mar. 1, 2017), pp. 1832-1843.

International Search Report and Written Opinion from Application No. PCT/US2021/038232 dated Oct. 14, 2021.

Amirabadi, "Soft-Switching High-Frequency AC-Link Universal Power Converters with Galvanic Isolation," 2013 Doctoral Dissertation Texas A&M University.

Office Action from Japanese Application No. 2022-577257 dated Mar. 18, 2025 (with English translation).

Office Action from Korean Application No. 10-2023-7000706 dated May 19, 2025 (with English translation).

* cited by examiner

SYNCHRONOUS REVERSE BLOCKING SWITCH FOR SOFT-SWITCHING CURRENT SOURCE CONVERTERS AND SOFT-SWITCHING CURRENT SOURCE CONVERTERS INCLUDING THE SAME

CROSS-REFERENCE TO RELATED APPLICATIONS

This application claims the benefit of U.S. Provisional Application No. 63/041,632, filed 19 Jun. 2020, and entitled "Synchronous Reverse Blocking Switch for Soft-Switching Current Source Converters," which is incorporated by reference herein in its entirety.

FIELD OF DISCLOSURE

The present disclosure relates to electric power converters, and more particularly to reverse blocking switches for soft-switching current source converters.

BACKGROUND

Current-sourced converters (CSC) require reverse blocking (RB) switches as their main semiconductor devices. Historically, owing to larger conversion loss than their voltage-sourced counterparts, CSCs have been primarily used for high-power applications and operated at low switching frequencies where intrinsically reverse blocking switches such as thyristors, GTOs, and IGCTs are suitable choices.

In the related art, there is proposed a soft-switching CSC (SSCSC) topology, named the Soft-Switching Solid-State Transformer (S4T), that may greatly reduce or virtually eliminate semiconductor switching losses through zero-voltage switching (ZVS) operation and allowed for a dramatic increase in the switching frequency. This new family of modular power converters features flexible inputs and outputs interfacing with DC, single-phase, or multiphase AC sources and loads, high-frequency isolation, fast control dynamics, low dv/dt, benign failure modes, and high conversion efficiency. A description of S4T may be found in PCT Application No. PCT/US2019/042969 filed Jul. 23, 2019 and PCT Application No. PCT/US2017/033186 filed May 17, 2017, the entire disclosures of which are incorporated herein by reference as if fully set forth below. Another family of soft-switching CSC topologies, named Soft-Switching Current Source Inverters (SSCSI), is proposed in the related art and can also benefit from the synchronous reverse blocking switch disclosed herein. A description of SSCSI may be found in PCT Application No. PCT/US2020/047882, the entire disclosure of which is incorporated herein by reference as if fully set forth below.

As a non-limiting example, the S4T topology lends itself to industrial power electronics applications at 480 VAC and >600 VDC, and has been scaled to medium voltage AC (MVAC) and medium voltage DC (MVDC) through series stacking of multiple modules. To reach the higher-frequency operation potential of the topology, related art RB switches may be made of the series connection of a fast-switching controlled device, such as a MOSFET or an IGBT, and a diode. This leads to a simple and rugged switch structure providing an excellent cost-efficiency tradeoff for most applications.

The S4T topology may also be used for higher-current, lower-voltage applications, to interface with touch-safe 48 VDC sources (lithium batteries and photovoltaic panels) and to address upcoming low-voltage power conversion needs. Some examples include 48 VDC hybrid vehicle systems, intrinsically safe low-voltage modular electric vehicle (EV) powertrains, power delivery for 5G wireless access points and data centers, and rapid deployment AC power sources for use after grid contingencies and in modular microgrids. In these applications, the related art RBs may include ultra-low resistance silicon MOSFETs or gallium nitride HEMTs in series with diodes, which can limit the voltage drop across the active device. However, the inventors have found that the forward voltage drop of the series low-voltage diode remains similar to that of the higher-voltage class diodes used in related art S4T, and are responsible for a significant amount of the conduction loss in the switch positions. For example, the inventors have found that 92% of the 5.3% efficiency loss in a 48 VDC bridge may be attributable to the diode.

Similar observations may also be true in any related art SSCSC application where the voltage drop across the series connected diode is substantially higher than the voltage drop across the series connected controlled switch.

Accordingly, it is desirable to improve the efficiency of said converters by improving or replacing the RB configuration. Aspects of the present disclosure relate to these and additional concerns.

SUMMARY

The present disclosure relates to synchronous reverse blocking switches (SRBS) for soft-switching current source converters. An example embodiment of the present disclosure provides a synchronous reverse blocking switch for a soft-switching current source converter (SSCSC), the switch including: a first controlled switch; a second controlled switch connected in series to the first controlled switch; and a delay generation circuit configured to control: the second controlled switch to turn on after a delay (t_dON) from the first controlled switch turning on, and the second controlled switch to turn off after a delay (t_dOFF) from the first controlled switch turning off.

An example embodiment of the present disclosure provides a soft-switching current source converter (SSCSC), including: a first SSCSC bridge, the first SSCSC bridge comprising at least one leg with two synchronous reverse blocking switches in series, each of the synchronous reverse blocking switches including: a first controlled switch; a second controlled switch connected in series to the first controlled switch; and a delay generation circuit configured to control: the second controlled switch to turn on after a delay (t_dON) from the first controlled switch turning on, and the second controlled switch to turn off after a delay (t_dOFF) from the first controlled switch turning off; a second SSCSC bridge; and inductive element connected between the first and second SSCSC bridges.

An example embodiment of the present disclosure provides a synchronous reverse blocking switch package for a soft-switching current source converter (SSCSC), the switch package including: a first controlled switch; a second controlled switch connected in series to the first controlled switch; and a delay generation circuit configured to control: the second controlled switch to turn on after a delay (t_dON) from the first controlled switch turning on, and the second controlled switch to turn off after a delay (t_dOFF) from the first controlled switch turning off.

An example embodiment of the present disclosure provides a synchronous reverse blocking switch (SRBS) package for a soft-switching current source converter (SSCSC), the switch package including: a plurality of SRBS modules, each of the SRBS modules including: a first controlled switch; a second controlled switch connected in series to the first controlled switch; and a delay generation circuit configured to control: the second controlled switch to turn on after a delay (t_dON) from the first controlled switch turning on, and the second controlled switch to turn off after a delay (t_dOFF) from the first controlled switch turning off.

These and other aspects of the present disclosure are described in the Detailed Description below and the accompanying drawings. Other aspects and features of embodiments will become apparent to those of ordinary skill in the art upon reviewing the following description of specific, exemplary embodiments in concert with the drawings. While features of the present disclosure may be discussed relative to certain embodiments and figures, all embodiments of the present disclosure can include one or more of the features discussed herein. Further, while one or more embodiments may be discussed as having certain advantageous features, one or more of such features may also be used with the various embodiments discussed herein. In similar fashion, while exemplary embodiments may be discussed below as device, system, or method embodiments, it is to be understood that such exemplary embodiments can be implemented in various devices, systems, and methods of the present disclosure.

BRIEF DESCRIPTION OF THE DRAWINGS

The following detailed description of specific embodiments of the disclosure will be better understood when read in conjunction with the appended drawings. For the purpose of illustrating the disclosure, specific embodiments are shown in the drawings. It should be understood, however, that the disclosure is not limited to the precise arrangements and instrumentalities of the embodiments shown in the drawings.

DETAILED DESCRIPTION

To facilitate an understanding of the principles and features of the present invention, various illustrative embodiments are explained below. The components, steps, and materials described hereinafter as making up various elements of the embodiments disclosed herein are intended to be illustrative and not restrictive. Many suitable components, steps, and materials that would perform the same or similar functions as the components, steps, and materials described herein are intended to be embraced within the scope of the disclosure. Such other components, steps, and materials not described herein can include, but are not limited to, similar components or steps that are developed after development of the embodiments disclosed herein. The present disclosure relates to synchronous reverse blocking switches for soft-switching current source converters.

Figure 1A:
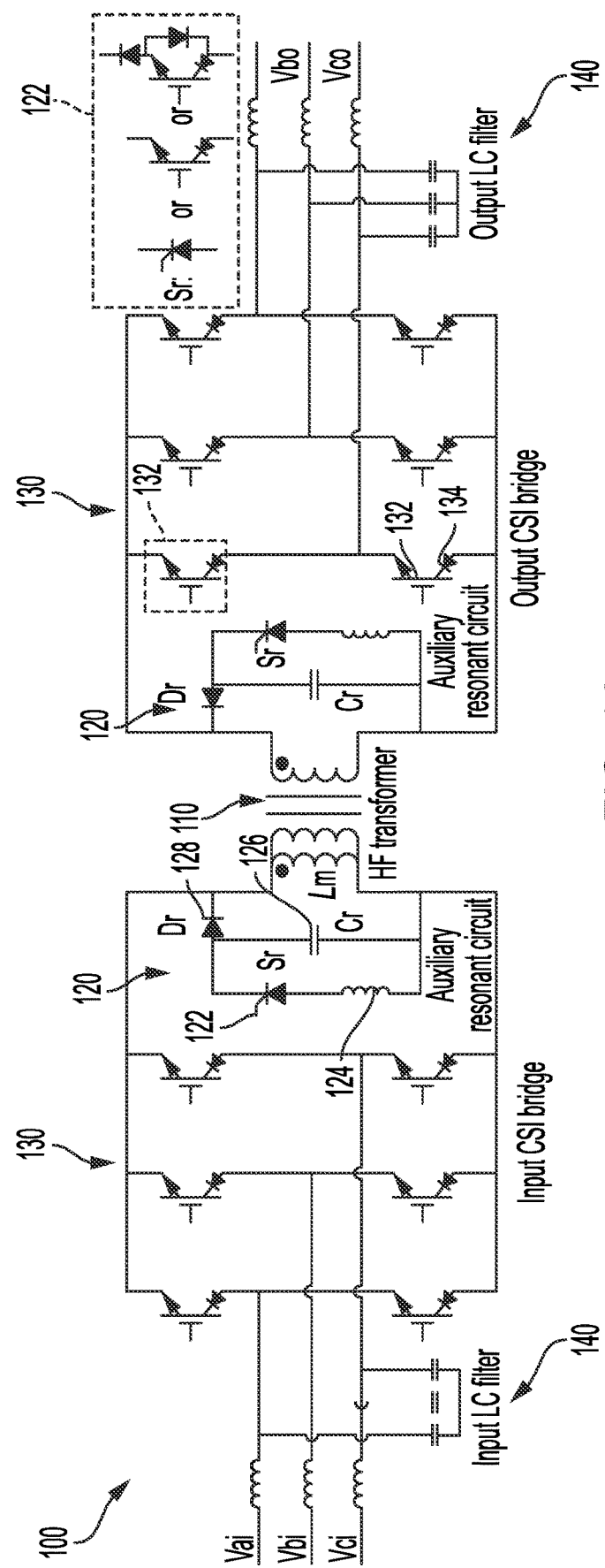
FIG. 1A shows a soft-switching current source converter according to the related art.
Figure 1B:
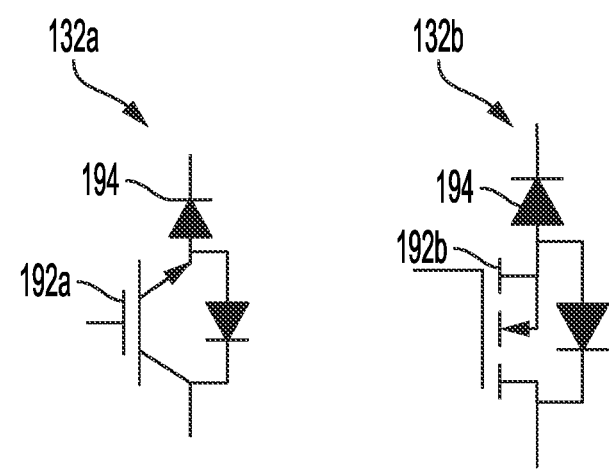
FIG. 1B shows RB switch assemblies for soft-switching current source converters according to the related art.

Referring to FIG. 1, shown is an example of a soft-switching current source converter topology 100 in the related art. An isolated converter 100 includes four elements: 1) a high-frequency (HF) transformer 110 (e.g., a multi-winding HF transformer) to provide galvanic isolation and an amount of energy storage; 2) current source converter (CSC) bridges 130 to interface with sources and loads; 3) terminal LC filters 140 for suppressing harmonics; and 4) auxiliary resonant circuits 120 to provide zero voltage switching (ZVS) conditions for all the main devices. The CSC bridges 130 are configured with reverse blocking switches 132 (e.g., reverse blocking switch 132) in phase legs that conduct current in one direction but block voltage in both directions. Referring to FIG. 1B, switches 132 can be a switch assembly that comprises a reverse conducting controlled switch (e.g., a IGBT 192a, MOSFET 192b, or a functionally equivalent device, such as a high-electron-mobility transistor (HEMT)) connected in series to a diode 194. The controlled switch may be a switch with a gate-controlled turn ON and gate-controlled turn OFF. This may allow the SSCSC to reach the high-frequency operation potential of the topology. The controlled switch and/or diodes can be formed with silicon, silicon carbide, and/or a wide-bandgap semiconductor. The auxiliary resonant circuits 120 include an active device Sr 122 (e.g., a reverse blocking switch or reverse blocking switch assembly), an inductor 124 (e.g., resonant inductor 124), a capacitor 126 (e.g., resonant capacitor 126), and a diode 128 (e.g., a damping diode 128) placed within auxiliary resonant circuits 120 between capacitor 126 and the transformer 110. The active device Sr 122 can be an IGBT in series with a diode, an RB-IGBT, a thyristor, or the like. Two auxiliary resonant circuits 120 can be required to provide ZVS transitions for the devices of the input and output CSC bridges 130, respectively, due to the transformer leakage inductance. While FIG. 1 illustrates a topology applicable to a 3-phase to 3-phase converter, one of ordinary skill will recognize in light of the present disclosure that aspects of the present disclosure can be applied to alternative configurations (such as 1-phase versions, VAR compensators, DC-AC, DC-DC, and non-isolated topologies).

However, as discussed above, soft-switching isolated converter topologies in the related art can suffer from efficiency losses driven greatly from diodes of RB switch assemblies 132. Accordingly, there is a need to provide alternative solutions to improve circuit efficiency.

Figure 2A:
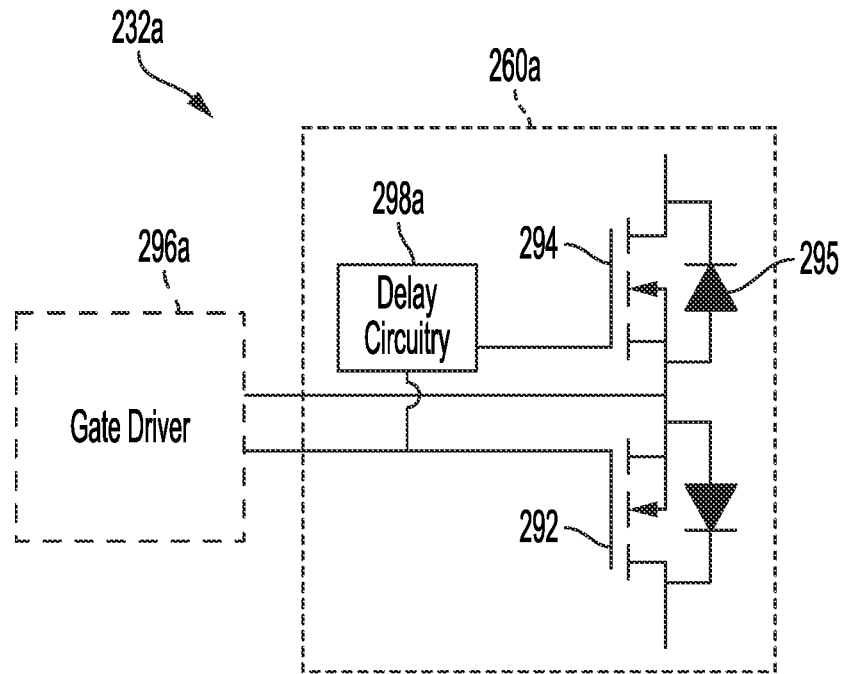
FIGS. 2A and 2B show synchronous RB switches for soft-switching current source converters, in accordance with embodiments of the disclosure.
Figure 2B:
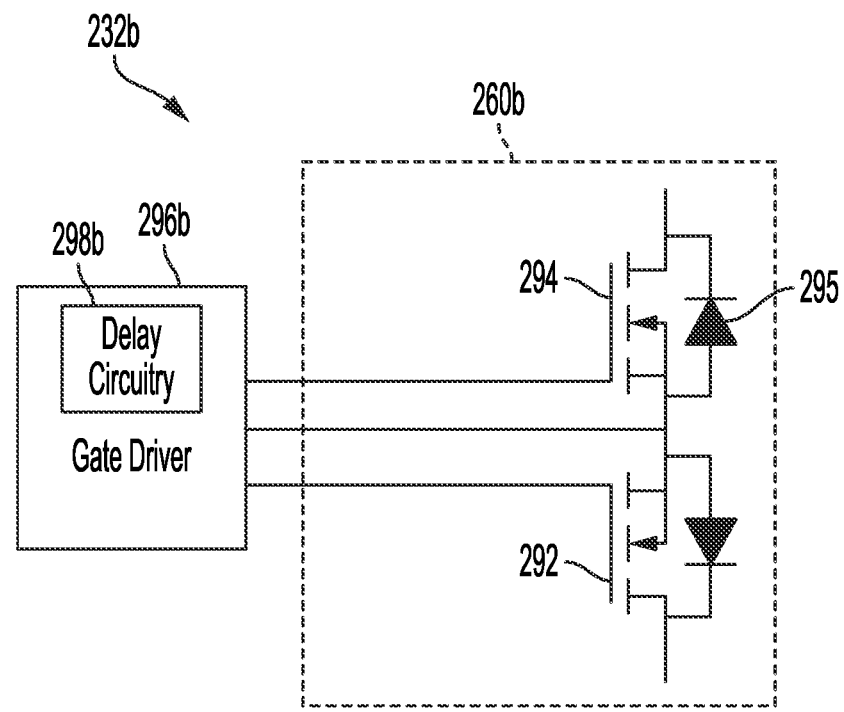

FIGS. 2A and 2B illustrate synchronous reverse blocking switches (SRBS) 232a and 232b according to aspects of the present disclosure. Referring to FIG. 2A, SRBS 232a includes a first controlled switch 292 (e.g., an active switch or S_A), a second controlled switch 294 (e.g., a rectifier switch or S_R) connected in series through respective reference pins (e.g., source pins for MOSFETs and emitter pins for IGBTs), and passive delay generation circuitry 298a configured to passively delay an activation/deactivation signal for S_R 294. S_A 292 and S_R 294 may be N-channel MOSFETs, but this is merely an example. S_R 294 replaces diode 194 in switch 132b. The reverse conduction path 295 of S_R 294 (e.g., body diode 295 or anti-parallel diode 295) acts as the series diode 194 of the RB switch 132b when S_R 294 is turned off. Thus, to reduce conduction loss of SRBS 232a, it is desirable to turn on the channel of switch S_R 294 to minimize the conduction time of the reverse conduction path 295.

Gate driver 296a controls the combination 260a of S_A 292, S_R 294, and delay circuitry 298a using a single gate output and receiving a single gate reference connection from the combination. In addition, gate driver 296a may receive a single gate control signal from a control system of the soft-switching current source converter. Thus, the combination 260a of S_A 292, S_R 294 and delay circuitry 298a can be a drop-in replacement to the reverse blocking switches 132a, 132b in the related art, and gate driver 296a may be a standard gate driver as would be used in related art soft-switching current source converters.

Referring to FIG. 2B, SRBS 232b includes a first controlled switch 292 (e.g., an active switch or S_A) and a second controlled switch 294 (e.g., a rectifier switch or S_R) connected in a manner similar to that described with reference to FIG. 2A. However, delay circuitry 298b is included within gate driver 296b and may be implemented with active circuitry. Accordingly, gate driver 296b may be a specialized gate driver 296b configured to implement the delay functionality (and/or additional functionality) in addition to the functions generally available in the related art. In addition, gate driver 296b may receive a single gate control signal from the control system of the soft-switching current source converter.

SRBS 232a and 232b may utilize a methodology that uniquely leverages the operating principles and switching environment of soft-switching current source converter topologies, such as the S4T topology, to exploit the conduction loss reduction of the dual-switch structure while mitigating the related art concerns of reverse recovery and sensitivity to shoot-through faults that typically plague this kind of structure.

In particular, the combination of the unique switching environment of soft-switching current source converters and appropriate gate driver 296b circuitry and/or delay circuitry 298a, 298b and controls can eliminate the reverse recovery phenomenon of the reverse conduction path 295. In addition, there is no risk of entering a shoot-through state under normal operation. These are significant improvements over related art dual-switch structures for conventional converters, where shoot-through conditions and fault modes can arise at every switching cycle and require complex monitoring and gating strategies limiting the utilization of the switch channel conduction. Additionally, certain related art applications can only avoid these undesirable events through precisely timed, multi-step gating sequences that are prone to catastrophic failure, and rely upon sophisticated, fast, and precise sensing techniques. Additionally or alternatively, the related art approaches often cannot avoid reverse recovery effects unless through the use of wide band gap technologies for the switches, which may not be possible or feasible in all circumstances.

Figure 3:
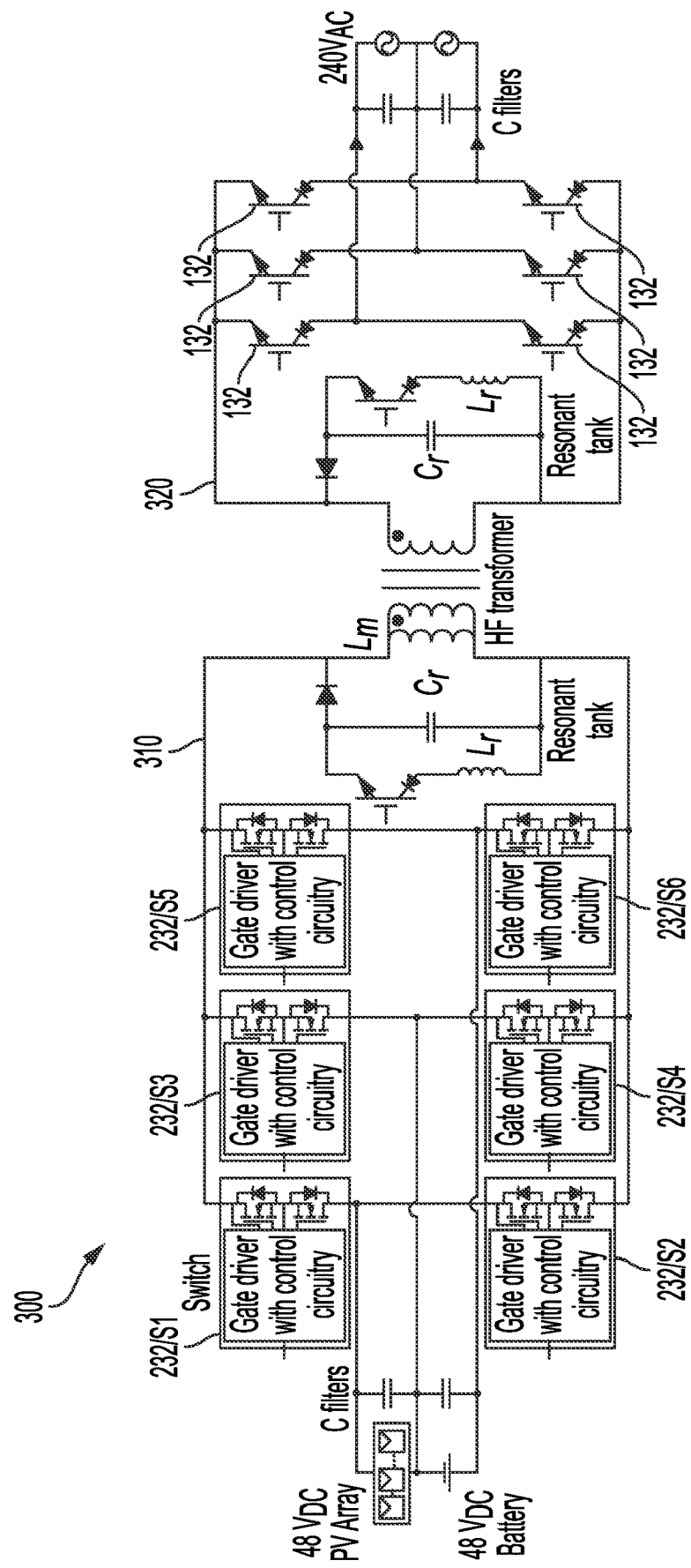
FIG. 3 shows a soft-switching current source converter using an example synchronous RB switch, in accordance with an embodiment of the disclosure.

Although FIGS. 1 and 3 illustrates a current source converter with HF transformer 110, one of ordinary skill will recognize in light of the present disclosure, that various alternative inductive elements can be included as energy storage in various configurations within soft-switching current source converters as previously disclosed without departing from the scope of the present disclosure. As non-limiting examples, inductive elements can include a shunt inductor or a series inductor, both with appropriate resonant circuits.

FIG. 3 illustrates an example S4T 300 utilizing synchronous reverse blocking switches 232 according to an example. As can be seen, DC Bridge 310 utilizes reverse blocking switches 232, while AC Bridge 320 utilizes reverse blocking switches 132. FIG. 3 illustrates a 1 kW, 48V DC to 240V AC S4T. One of ordinary skill in light of the present disclosure will understand that this is merely an example, and synchronous reverse blocking switches 232 may be utilized in various additional or alternative S4T implementations.

Figure 4:
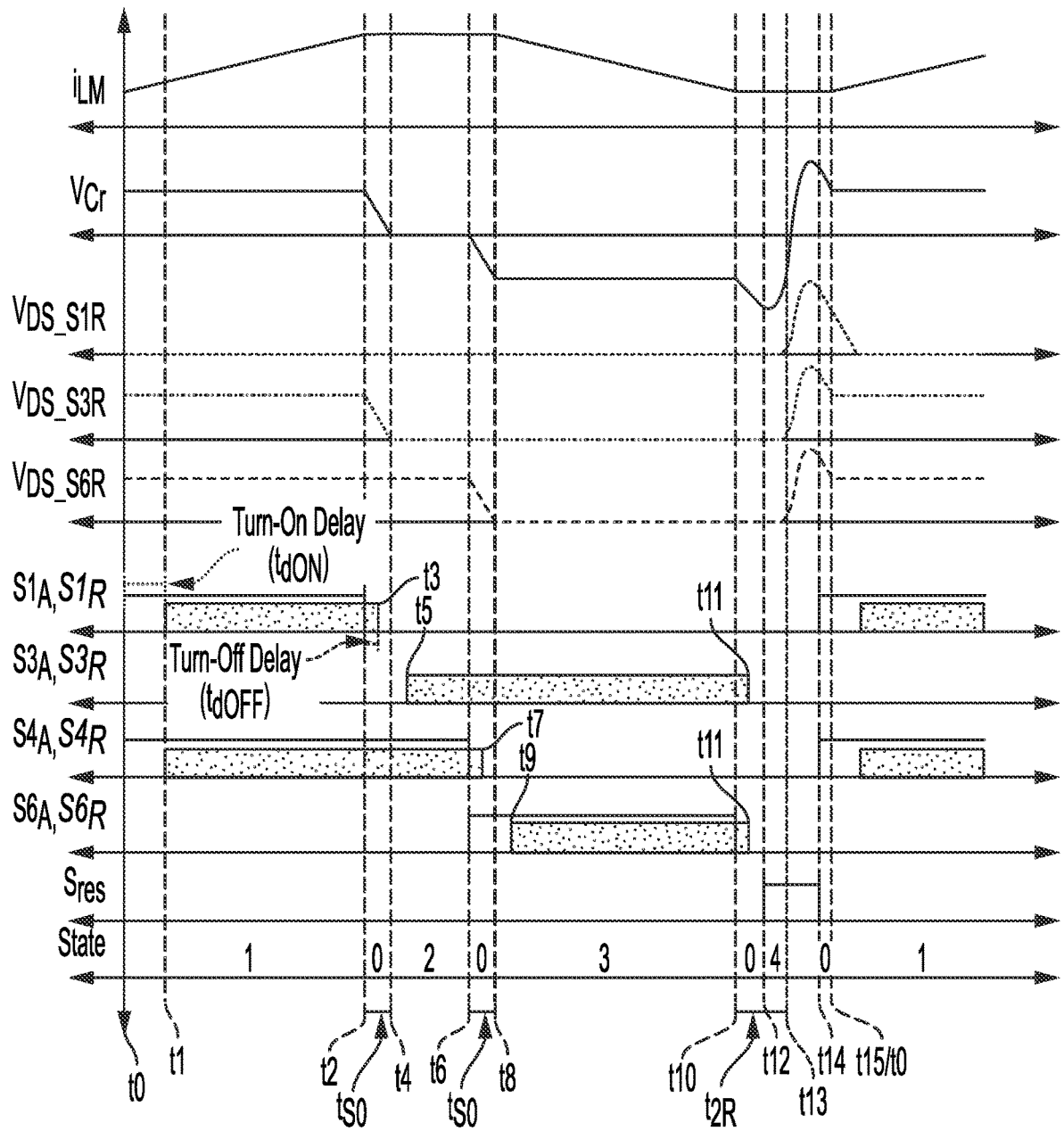
FIG. 4 illustrates an example gating sequence waveform of synchronous RB switch in a soft-switching current source converter DC Bridge, in accordance with an embodiment of the disclosure.
Figure 5A:
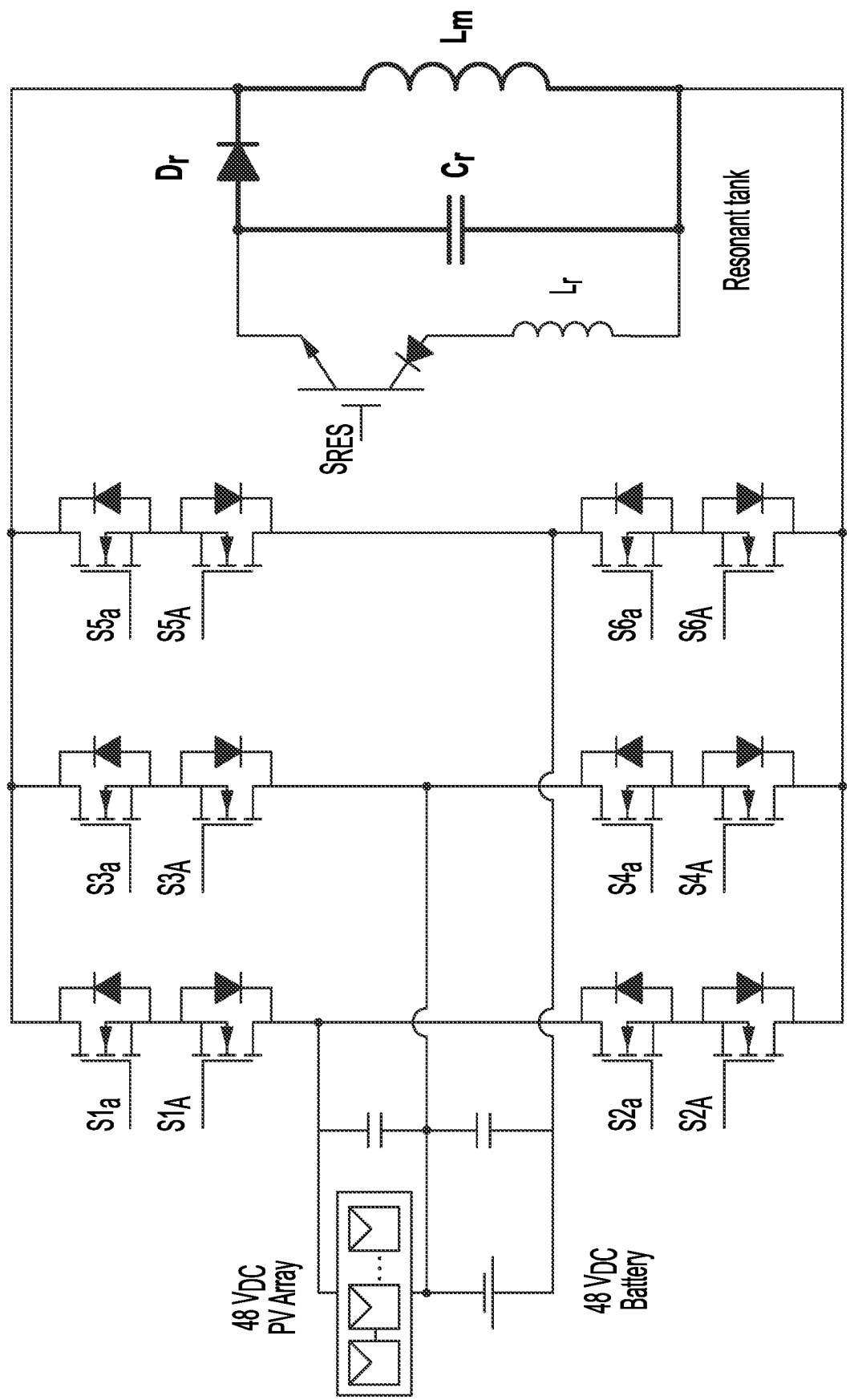
FIGS. 5A-5E illustrate various switching states of a soft-switching current source converter DC Bridge, in accordance with an embodiment of the disclosure.
Figure 5B:
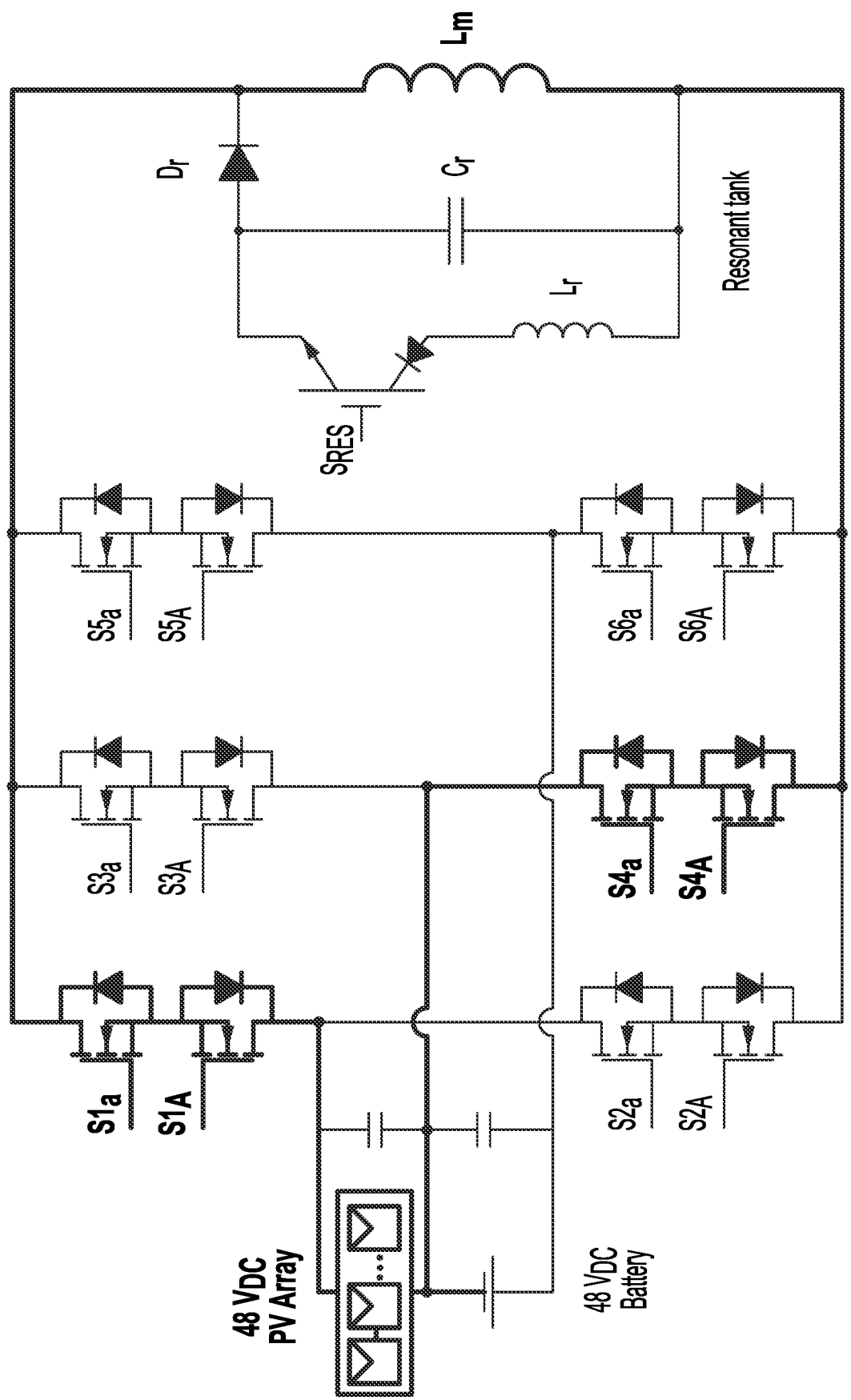
Figure 5C:
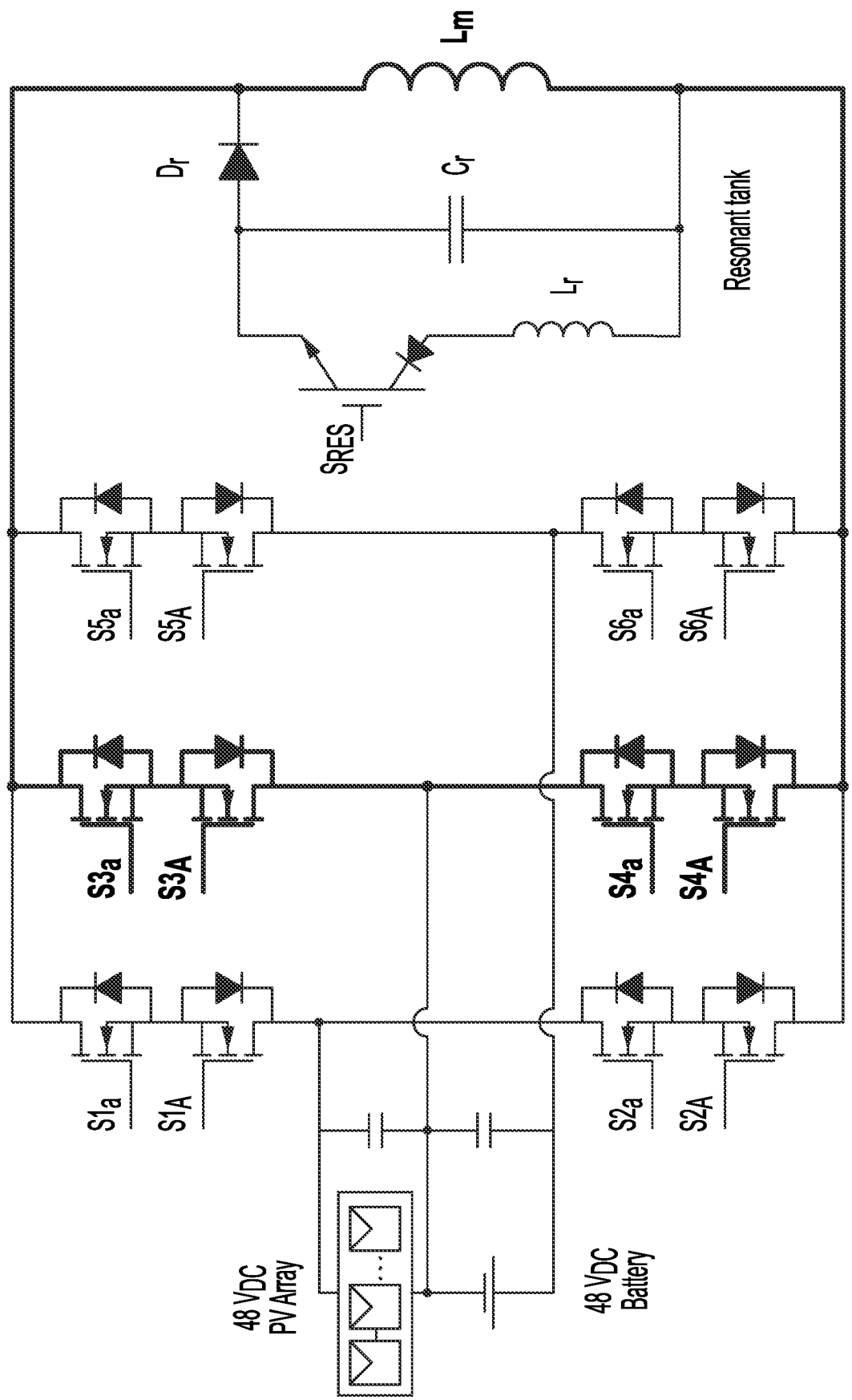
Figure 5D:
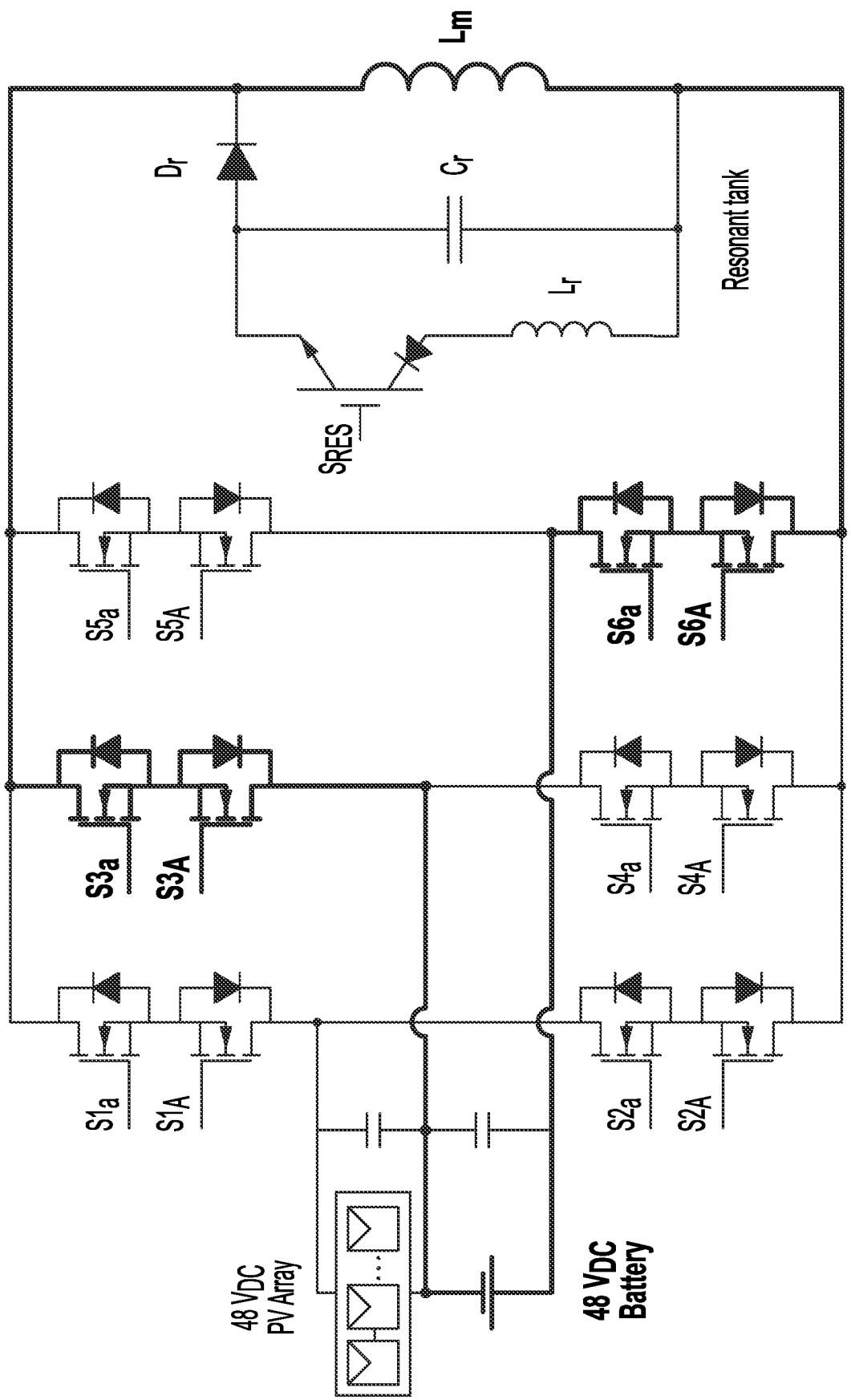
Figure 5E:
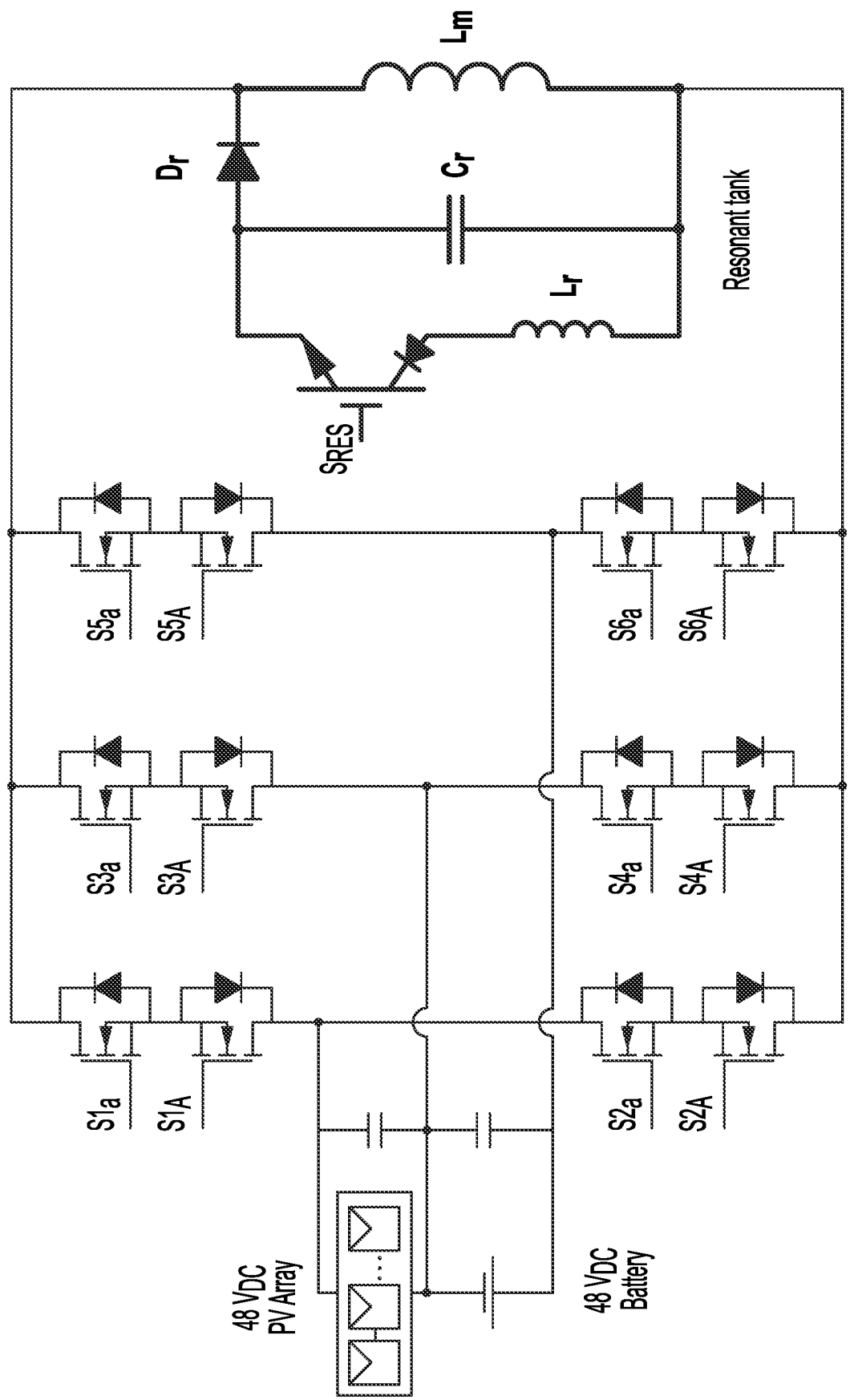

FIG. 4 illustrates an example gating sequence waveform 400 of DC Bridge 310 where power is circulated on the battery port. FIGS. 5A-5E illustrate various switching states of DC Bridge 310. Initially (t0), DC Bridge 310 is set to State 1 (FIG. 5B), and S_A 292 of S1 (S1_A) and S_A 292 (S4_A) of S4 are turned on. After a turn-on delay (t_dON), S_R 294 of S1 (S1_R) and S_R 294 of S4 (S4_R) are turned on at t1. Next, DC Bridge 310 switches to State 0 (FIG. 5A) (t2), and S_A 292 of S1 (S1_A) is turned off and S_A 292 of S3 (S3_A) is turned on. After another time delay (t_dOFF), S_R 294 of S1 (S1_R) is turned off at t3. At t4, the ZVS transition is complete and DC Bridge 310 switches to State 2 (FIG. 5C). At t5, S_R 294 of S3 (S3_R) is turned on.

Figure 6A:
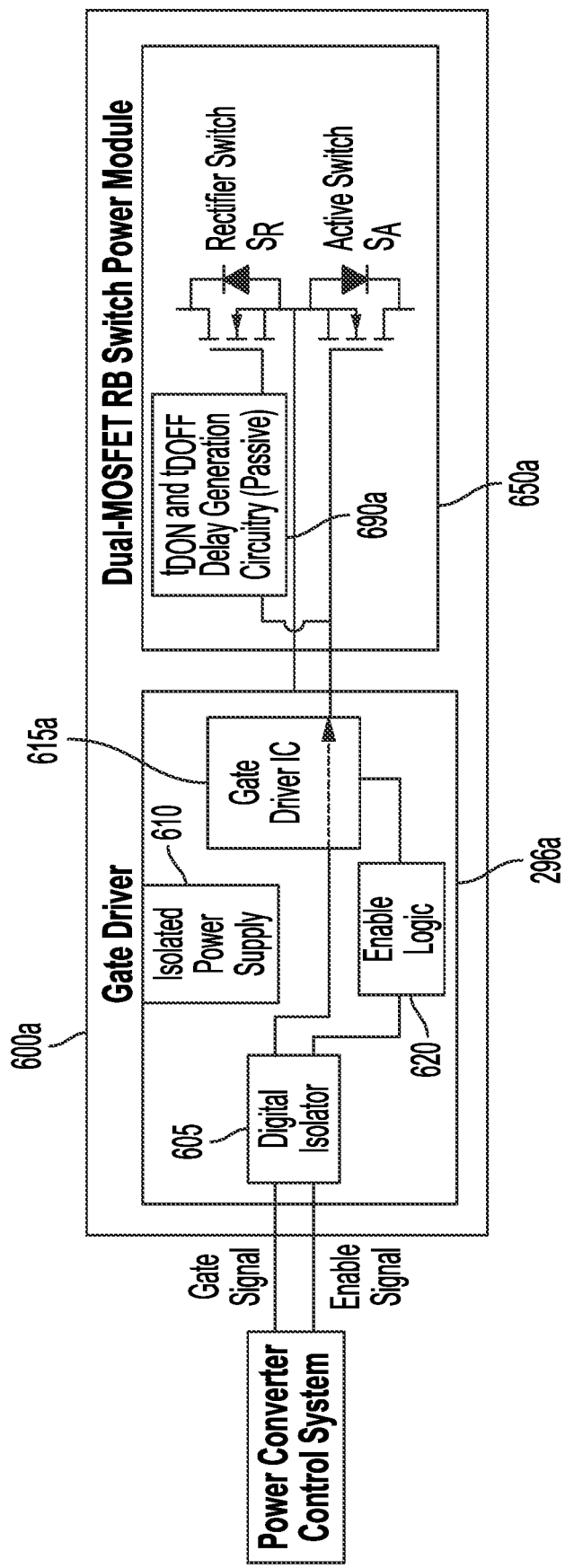
FIGS. 6A and 6B illustrate various synchronous reverse blocking switches, in accordance with embodiments of the disclosure.

At t6, DC Bridge 310 again transitions to State 0. S_A 292 of S4 (S4_A) is turned off and S_A 292 of S6 (S6_A) is turned on. At t7, S_R 294 of S4 (S4_R) is turned off following a delay (t_dOFF). The DC Bridge 310 switches to State 3 (FIG. 5D) at t8. At t9, S_R 294 of S6 (S6_R) is turned on. At t10, both S_A 292 of S3 (S3_A) and S_A 292 of S6 (S6_A) are turned off, transitioning DC Bridge 310 back to State 0, followed by the turn off of S_R 294 of S3 (S3_R) and S_R 294 of S6 (S6_R) at t11. As would be understood by one of ordinary skill in light of the present disclosure, S_R 294 of S3 (S3_R) and S_R 294 of S6 (S6_R) may be turned off at different times. In some cases, one or both of S_R 294 of S3 (S3_R) and S_R 294 of S6 (S6_R) may be turned off at any time after t10 and before t13 without issue. At t12, switch Sres is turned on and Bridge 310 transitions to State 4 (FIG. 5E), and the resonant capacitor voltage flips polarity between t12 and t14. The DC Bridge 310 transitions again to State 0, before restarting the cycle at t15/t0.

t_dON may be a fixed period such that t_dON is greater than the ZVS transition period t_S0 of DC Bridge 310 to avoid unwanted hard switching actions. All switches S1-S6 can have a same t_dON. However, this is merely an example and, in some cases, at least one switch S1-S6 may be designed to have a different t_dON, and no catastrophic failure can arise if at least one switch S1-S6 has a t_dON that is smaller than the transition period t_S0.

t_dOFF may be a fixed period such that t_dOFF is less than the period between switching to State 0 at t10 and the start of the resonant capacitor voltage polarity flip where the voltage across at least one of the second controlled switch S_R 294 (e.g., S1_R in S1, S3_R in S3, or S6_R in S6) become positive at t13 (t2R) (e.g., the minimum time-to-resonance of the DC Bridge 310). This enables all switches S1-S6 to have a same t_dOFF and protects against possible shoot-through conditions. However, this is merely an example and, as will be understood by one of ordinary skill in light of the present disclosure, each S_R 294 should be turned off by the time at which the resonant capacitor voltage matches the voltage of the most negative vector at t13. Earlier switches in the cycle could utilize longer t_dOFF than switches later in the cycle. It will also be understood by one of ordinary skill in light of the present disclosure that this delayed turn off of each S_R 294 minimizes and/or protects against reverse recovery issues. It will further be understood by one of ordinary skill in light of the present disclosure that this delayed turn off of each S_R 294 is made possible by the unique switching environment of the SSCSCs.

t_dON and t_dOFF may be controlled by gate driver 296 with dedicated delay generation circuitry and/or passive delay circuitry. For example, referring to FIG. 6A, SRBS 600a includes Gate Driver 296a (e.g., a standard gate driver) and switch module 650a. Gate Driver 296a includes a digital isolator 605, an isolated power supply 610, gate driver integrated circuit 615a, and enable logic 620 (e.g., hardware and/or software enable logic) for enabling the gate driver integrated circuit 615a. Gate driver integrated circuit 615a provides a single activation and/or deactivation signal to the combination of S_A 292 and S_R 294. Delay generation circuitry 690a may passively generate t_dON and t_dOFF from this single signal.

In some cases, switch module 650a may be a standalone package including the rectifier switch, active switch, and passive delay generation circuitry 690a. A single gate-control input pin and reference voltage pin may be exposed to a gate driver. Accordingly, because the gate driver does not control the active switch and the rectifier switch independently, the gate driver may be unable to distinguish between a package containing switch module 650a and a package containing a switch in the related art. Therefore, the switch module 650a may operate without special higher-level controls (i.e., in the gate driver or overall circuit controls), and may serve as a drop-in replacement for reverse blocking switches of soft-switching current source converters in the related art.

Figure 7:
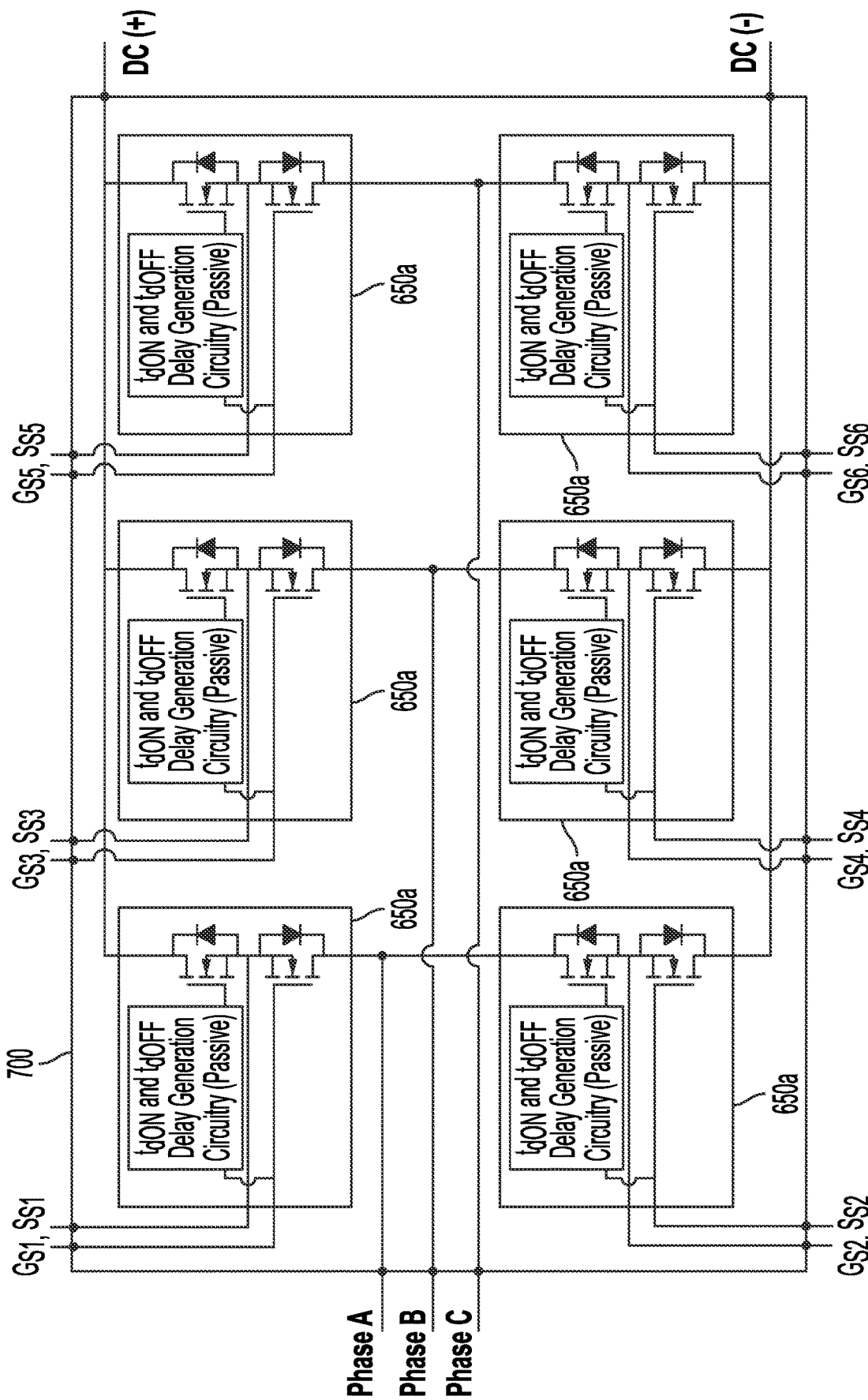
FIG. 7 illustrates a switch package with synchronous RB switches in accordance with an embodiment of the disclosure.

As would be understood by one of ordinary skill in light of the present disclosure, multiple switch modules 650a may be incorporated into a single package, with each switch module 650a providing respective gate-control input pins and reference voltage pins. For example, four (or six) switch modules 650a may be incorporated into a single package. In such a case, the package would have four (or six) gate-control input pins and four (or six) reference voltage pins corresponding to respective switch modules 650a. FIG. 7 illustrates a switch package 700 with six switch modules 650a according to aspects of the present disclosure. Each switch module 650a has a respective gate-control pin (GS1-GS6) and reference voltage pin (SS1-SS6). Additionally, switch package may have phase terminals A, B, and C, as well as positive and negative DC current terminals.

Figure 6B:
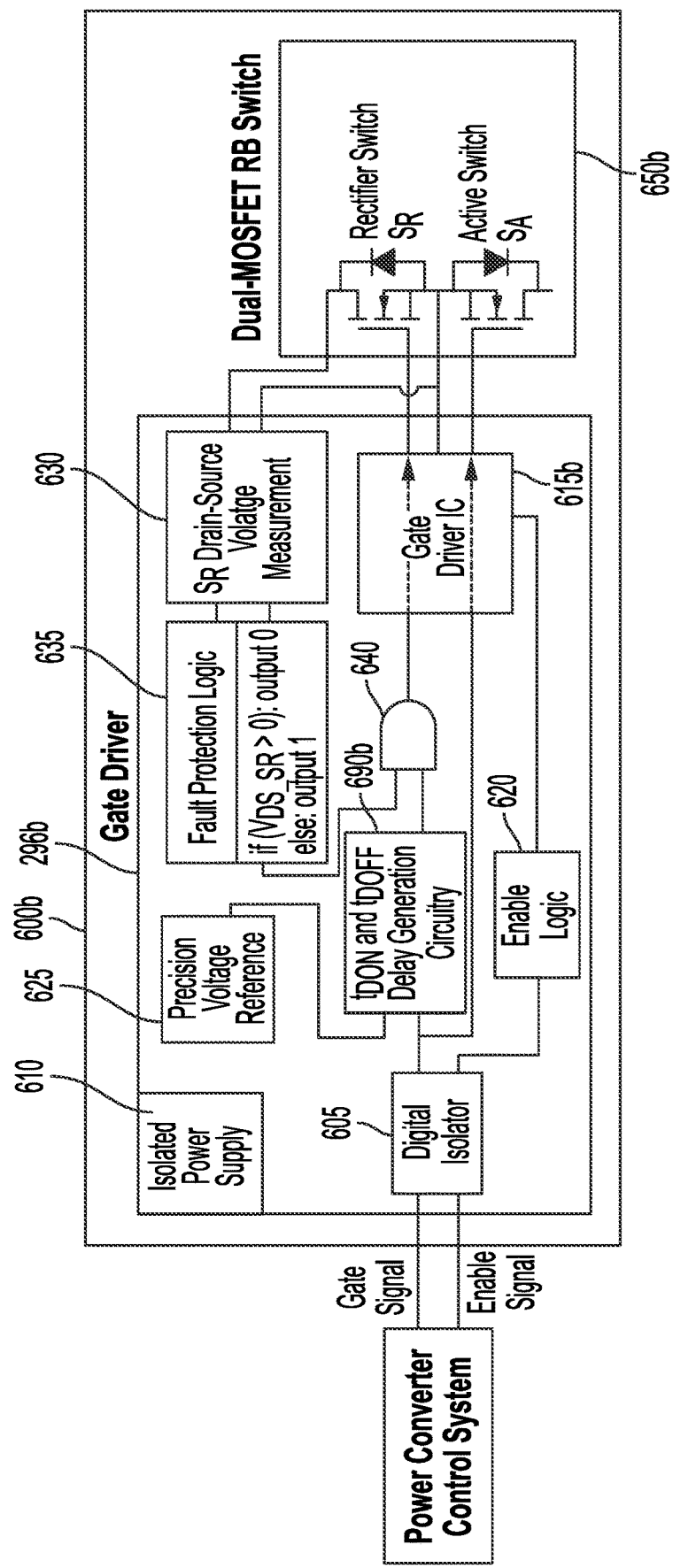

Referring to FIG. 6B, SRBS 600b includes Gate Driver 296b and switch module 650b. Gate Driver 296b may include a digital isolator 605, an isolated power supply 610, gate driver integrated circuit 615b, enable logic 620 (e.g., hardware and/or software enable logic) for enabling the gate driver integrated circuit 615b. In this implementation, gate driver 296b may further include a precision voltage reference 625 and a delay generation circuitry 690b. The delay generation circuitry 690b may be implemented by hardware, software, or a combination of hardware and software. Because the delay generation circuitry 232b is included in gate driver 296b, gate driver integrated circuit 615b may provide respective activation/deactivation to S_A 292 and S_R 294.

Additionally, gate driver 296b may also measure a voltage across S_R 294, e.g., using a drain-source voltage sensing circuit 630 (e.g., a voltage divider). Meanwhile, fault protection logic 635 (e.g., a fault protection circuit, a comparator circuit) may receive the voltage measurement from sensing circuit 630 and prevent activation and/or deactivation or force activation/deactivation signals to S_R 294 (e.g., through AND gate 640). For example, when the voltage across S_R 294 is positive (e.g., as measured with respect to the reference terminal voltage of S_R 294 and S_A 292, the measured voltage being equivalent to the drain-source voltage in the case that S_R 294 is realized using a MOSFET or a HEMT), fault protection logic 635 may prevent the turn ON/activation of the S_R 294. That is, to eliminate a potential for shoot-through under abnormal operating conditions, SRBS 600b uses gating control of sensing the drain-source voltage across switch S_R 294, and preventing the device from being gated ON if the reverse conduction path 295 of S_R 294 is reverse-biased (e.g., drain-source voltage is positive). An added benefit of this protection mechanism is to ensure the switching transition (e.g., zero-voltage switching) is completed even when condition t_dON is less than the ZVS transition period t_S0, and generally relaxes the aforementioned timing constraints on t_dON and t_dOFF.

In another example, when the voltage across S_R 294 exceeds a threshold value, fault protection logic 635 may force the turn OFF/deactivation of the S_R 294.

In some cases, SRBS 600a or 600b may be a standalone solution including the rectifier switch, active switch, and the gate driver. A single gate signal and a single enable signal may be provided to the package from a power converter control system. Accordingly, because the power converter control system does not control the active switch and the rectifier switch independently, the power converter control system may be unable to distinguish between an implementation containing switch assemblies SRBS 600a/600b and an implementation containing a switch in the related art. Therefore, the switch assemblies SRBS 600a/600b may operate without special higher-level controls (i.e., from power converter control system).

As will be understood by one of ordinary skill, the proposed SRBS 232/600 described herein may have several benefits. Without a particular order, first SRBS 232/600 may reduce conduction losses in SSCSC applications by up to an order of magnitude depending on the application. Moreover, these savings may be had without suffering from reverse recovery issues and complex fault modes, or having to rely on complex/sophisticated gating patterns as required in related art solutions.

Second, the simple control technique, with potentially fixed S_R 294 turn-on and turn-off gating delays (t_dON and t_dOFF), leverages the unique SSCSC switching environments and allows the conduction loss improvement to be exploited with minimal to no reverse recovery, irrespective of the semiconductor technology used, and even when standard silicon devices are used.

Third, by leveraging the unique SSCSC switching environments, the operable ranges of t_dON and t_dOFF are significantly greater than the timing controls required in related solutions. This is done without compromising efficiency gains or safe operation. That is, t_dON and t_dOFF are capable of being set within a wide range of values and do not require precise replicability without affecting the operability of the SRBS or a soft-switching current source converter including the same.

Fourth, utilizing a gate driver with integrated delay generation (e.g., 298b) or a gate driver (e.g., 296a) and a module with passive delay generation circuit (e.g. 650a) abstracts the complexity of controlling the two switches S_A 292 and S_R 294 from the high-level power converter control system. That is, the main controller needs to send only one turn ON/OFF signal per switch position, while SRBS 232/600 appropriately derives the proper gating sequence to drive the physical switches S_A 292 and S_R 294.

Further, a relatively uncomplicated fault protection mechanism may be implemented at the gate-driver level by sensing the S_R 294 switch drain-source voltage and preventing turn-on and/or forcing turn-off of the switch position if the drain-source voltage is of a positive polarity (e.g., the body diode is reverse biased) and/or exceeds a threshold value. This may provide a robust and rugged structure, even under abnormal conditions including converter transients and faults.

Additionally, SRBS 232/650*a* can be integrated into standard power module designs by implementing the S_R delay generation circuit with passive components, requiring only one gate pin per SRBS switch position, and simplifying integration with related art S4T and SSCSI variants, standard gate drivers, and system controllers.

Additionally, SRBS 232/600*b* can be integrated into standard power module designs by implementing the S_R delay generation with specialized gate driver circuitry, requiring only one gate control connection per SRBS switch position, and simplifying integration with related art S4T and SSCSI variants and system controllers.

Additional features of synchronous reverse blocking switches in S4T applications are described by the inventors in A. Marellapudi, M. J. Mauger, P. Kandula and D. Divan, "Enabling High Efficiency in Low-Voltage Soft-Switching Current Source Converters," 2020 *IEEE Energy Conversion Congress and Exposition* (*ECCE*), 2020, pp. 3456-3463, doi: 10.1109/ECCE44975.2020.9235719, the disclosure of which is incorporated herein by reference in its entirety as if set forth below.

An embodiment of the present disclosure may be implemented according to at least the following:

Clause 1: A synchronous reverse blocking switch for a soft-switching current source converter (SSCSC), the switch comprising: a first controlled switch; a second controlled switch connected in series to the first controlled switch; and a delay generation circuit configured to control: the second controlled switch to turn on after a delay (t_dON) from the first controlled switch turning on, and the second controlled switch to turn off after a delay (t_dOFF) from the first controlled switch turning off.

Clause 2: The synchronous reverse blocking switch of clause 1, wherein t_dON is a predetermined duration.

Clause 3: The synchronous reverse blocking switch of Clause 1 or Claus 2, wherein t_dON is a fixed duration.

Clause 4: The synchronous reverse blocking switch of any of Clauses 1-3, wherein t_dOFF is a predetermined duration.

Clause 5: The synchronous reverse blocking switch of any of Clauses 1-4, wherein t_dOFF is a fixed duration.

Clause 6: The synchronous reverse blocking switch of any of Clauses 1-6, further comprising a gate driver.

Clause 7: The synchronous reverse blocking switch of Clause 6, wherein the gate driver comprises the delay generation circuit.

Clause 8: The synchronous reverse blocking switch of any of Clauses 1-7, wherein the delay generation circuit comprises a delay circuit configured to delay a turn on control signal for the second controlled switch by the delay t_dON and delay a turn off control signal by the delay t_dOFF.

Clause 9: The synchronous reverse blocking switch of any of Clauses 6-8, wherein the gate driver transmits a single activation signal and a single deactivation signal to control both the first controlled switch and second controlled switch, the delay generation circuitry being between the second controlled switch and the gate driver, and the delay generation circuitry controlling the second controlled switch to turn on after the delay t_dON and to turn off after the delay t_dOFF.

Clause 10: The synchronous reverse blocking switch of any of Clauses 1-9, wherein the delay generation circuit comprises a passive delay circuitry.

Clause 11: The synchronous reverse blocking switch of any of Clauses 1-10, wherein the passive delay circuitry is integrated within a package including the first and second controlled switches and with a single gate control interface to externally control both the first and second controlled switches.

Clause 12: The synchronous reverse blocking switch of any of Clauses 1-11, further comprising a gate driver having a sensing circuit configured to measure a voltage across the second controlled switch.

Clause 13: The synchronous reverse blocking switch of any of Clauses 6-12, wherein the gate driver further comprises a fault protection circuit configured to prevent the turn ON/activation of the second controlled switch in response to the sensing circuit indicating that the voltage across the second controlled switch is positive, the voltage across the second controlled switch being measured such that the voltage is positive when the second controlled switch blocks a current.

Clause 14: The synchronous reverse blocking switch of amu of Clauses 1-13, wherein at least one of the first controlled switch and the second controlled switch is a silicon switch.

Clause 15: The synchronous reverse blocking switch of any of Clauses 1-14, wherein at least one of the first controlled switch and the second controlled switch comprises a silicon carbide or gallium nitride switch.

Clause 16: The synchronous reverse blocking switch of any of Clauses 1-15, wherein at least one of the first controlled switch and the second controlled switch is a metal-oxide-semiconductor field-effect transistor (MOSFET).

Clause 17: The synchronous reverse blocking switch of Clause 16, wherein the second controlled switch is connected in series to the first controlled switch through a source pin of the at least one MOSFET.

Clause 18: The synchronous reverse blocking switch of Clause 16 or Clause 17, wherein each of the first controlled switch and the second controlled switch is a MOSFET, and the second controlled switch is connected in series to the first controlled switch through respective source pins.

Clause 19: The synchronous reverse blocking switch of any of Clauses 1-17, wherein at least one of the first controlled switch and the second controlled switch is a high-electron-mobility transistor (HEMT).

Clause 20: The synchronous reverse blocking switch of Clause 19, wherein the second controlled switch is connected in series to the first controlled switch through a source pin of the at least one high-electron-mobility transistor (HEMT).

Clause 21: The synchronous reverse blocking switch of Clause 19 or Clause 20, wherein each of the first controlled switch and the second controlled switch is a HEMT, and the second controlled switch is connected in series to the first controlled switch through respective source pins.

Clause 22: The synchronous reverse blocking switch of any of Clauses 1-7, Clause 19, or Clause 20, wherein at least one of the first controlled switch and the second controlled switch is an insulated gate bipolar transistor (IGBT).

Clause 23: The synchronous reverse blocking switch of Clause 22, wherein the second controlled switch is connected in series to the first controlled switch through an emitter pin of the at least one IGBT.

Clause 24: The synchronous reverse blocking switch of Clause 22 or Clause 23, wherein each of the first controlled switch and the second controlled switch is an IGBT, and the second controlled switch is connected in series to the first controlled switch through respective emitter pins.

Clause 25: The synchronous reverse blocking switch of any of Clauses 6-24, wherein the gate driver is configured to receive a single gate control signal from a main controller of a soft-switching current source converter to control the first controlled switch and the second controlled switch.

Clause 26: The synchronous reverse blocking switch of any of Clauses 6-25, wherein the gate driver is agnostic to a control scheme or modulation strategy of a soft-switching current source converter in which the synchronous reverse blocking switch is used.

Clause 27: The synchronous reverse blocking switch of any of Clauses 1-26, wherein individual control of the first controlled switch and the second controlled switch is not implemented by a controller of the soft-switching current source converter in which the synchronous reverse blocking switch is used.

Clause 28: The synchronous reverse blocking switch of any of Clauses 1-27, wherein the delay generation circuit is configured to control the first and second controlled switches such that the synchronous reverse blocking switch is configured to experience minimal reverse recovery irrespective of the switch technology used.

Clause 29: The synchronous reverse blocking switch of any of Clauses 1-28, wherein the delay generation circuit is configured to control the first and second controlled switches such that the synchronous reverse blocking switch is configured to experience no reverse recovery irrespective of the switch technology used.

Clause 30: The synchronous reverse blocking switch of any of Clauses 1-29, wherein t_dON is greater than a zero voltage switching (ZVS) transition period of a SSCSC bridge in which the synchronous reverse blocking switch is used.

Clause 31: The synchronous reverse blocking switch of any of Clauses 1-30, wherein t_dOFF is less than a minimum time-to-resonance of a SSCSC bridge in which the synchronous reverse blocking switch is used.

Clause 32: The synchronous reverse blocking switch of any of Clauses 1-31, wherein the first controlled switch and the second controlled switch are different types of controlled switches.

Clause 33: The synchronous reverse blocking switch of any of Clauses 1-32, wherein the second controlled switch is connected in series to the first controlled switch via respective reference pins.

Clause 34: The synchronous reverse blocking switch of any of Clauses 1-33, wherein the first controlled switch and the second controlled switch are connected in series with opposite current blocking orientations.

Clause 35: The synchronous reverse blocking switch of any of Clauses 1-34, wherein the first controlled switch and the second controlled switch are oriented to block current in a direction towards the series connection.

Clause 36: The synchronous reverse blocking switch of any of Clauses 1-35, wherein the delay generation circuit is configured to control the second controlled switch to turn on after t_dON from the first controlled switch turning on and the second controlled switch to turn off after t_dOFF from the first controlled switch turning off by: receiving control signals for the first controlled switch; delaying the control signals; and sending the delayed control signals to the second controlled switch.

Clause 37: The synchronous reverse blocking switch of any of Clauses 6-36, wherein the gate driver further comprises a fault protection circuit configured to force a turn OFF/deactivation of the second controlled switch in response to the sensing circuit indicating that the voltage across the second controlled switch exceeds a threshold value.

Clause 38: A soft-switching current source converter (SSCSC), comprising: a first SSCSC bridge, the first SSCSC bridge comprising at least one leg with two synchronous reverse blocking switches of any of Clauses 1-37; a second SSCSC bridge; and inductive element connected between the first and second SSCSC bridges.

Clause 39: The SSCSC of Clause 38, wherein the inductive element comprises at least one from among a high-frequency transformer, series inductor, or a shunt inductor.

Clause 40: A synchronous reverse blocking switch package for a soft-switching current source converter (SSCSC), the switch package comprising the components of any of Clauses 1-37.

Clause 41: A synchronous reverse blocking switch (SRBS) package for a soft-switching current source converter (SSCSC), the switch package comprising the synchronous reverse blocking switch of any of Clauses 1-37.

Clause 42: The SRBS package of Clause 41 further comprising a single respective gate control pin for each of the switch modules.

Clause 43: The SRBS package of Clause 42 comprising a plurality of pairs of SRBS modules.

Clause 44: The SRBS package of Clause 43 further comprising a respective phase terminal corresponding to each pair of the SRBS modules.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way.

What is claimed is:

1. A synchronous reverse blocking switch for a soft-switching current source converter (SSCSC) comprising:
   a first controlled switch;
   a second controlled switch connected in series to the first controlled switch; and
   a delay generation circuit configured to control:
      the second controlled switch to turn on after a delay (t_dON) from the first controlled switch turning on;
      the second controlled switch to turn off after a delay (t_dOFF) from the first controlled switch turning off; and
      the first and second controlled switches such that both are simultaneously on during an overlap duration.

2. The synchronous reverse blocking switch of claim 1, wherein t_dON has a duration selected from the group consisting of a predetermined duration and a fixed duration; and
   wherein t_dOFF has a duration selected from the group consisting of a predetermined duration and a fixed duration.

3. The synchronous reverse blocking switch of claim 1, wherein a gate driver comprises the delay generation circuit.

4. The synchronous reverse blocking switch of claim 1 further comprising a gate driver configured to transmit a single activation signal and a single deactivation signal to control both the first controlled switch and second controlled switch, the delay generation circuit being between the second controlled switch and the gate driver, and the delay generation circuit configured to control the second controlled switch to turn on after the delay t_dON and to turn off after the delay t_dOFF.

5. The synchronous reverse blocking switch of claim 1, wherein the delay generation circuit comprises a passive delay circuitry integrated within a package including the first and second controlled switches and with a single gate control interface configured to externally control both the first and second controlled switches.

6. The synchronous reverse blocking switch of claim 1 further comprising a gate driver comprising:
   a sensing circuit configured to measure a voltage across the second controlled switch; and
   a fault protection circuit configured to prevent a turn ON/activation of the second controlled switch in response to the sensing circuit indicating that the voltage across the second controlled switch is positive;
   wherein the voltage across the second controlled switch is measured such that the voltage is positive when the second controlled switch blocks a current.

7. The synchronous reverse blocking switch of claim 1, wherein at least one of the first controlled switch and the second controlled switch is selected from the group consisting of a silicon switch, a silicon carbide, and gallium nitride switch.

8. The synchronous reverse blocking switch of claim 1, wherein each of the first controlled switch and the second controlled switch is a metal-oxide-semiconductor field-effect transistor (MOSFET); and
   wherein the second controlled switch is connected in series to the first controlled switch through respective source pins.

9. The synchronous reverse blocking switch of claim 1, wherein each of the first controlled switch and the second controlled switch is a high-electron-mobility transistor (HEMT); and
   wherein the second controlled switch is connected in series to the first controlled switch through respective source pins.

10. The synchronous reverse blocking switch of claim 1, wherein each of the first controlled switch and the second controlled switch is an insulated gate bipolar transistor (IGBT); and
    wherein the second controlled switch is connected in series to the first controlled switch through respective emitter pins.

11. The synchronous reverse blocking switch of claim 1, wherein at least one of:
    the delay generation circuit is configured to control the first and second controlled switches such that the synchronous reverse blocking switch is configured to experience minimal reverse recovery irrespective of a switch technology used;
    the delay generation circuit is configured to control the first and second controlled switches such that the synchronous reverse blocking switch is configured to experience no reverse recovery irrespective of a switch technology used; or
    t_dON is greater than a zero voltage switching (ZVS) transition period of a SSCSC bridge in which the synchronous reverse blocking switch is used.

12. A synchronous reverse blocking switch package comprising:
    the synchronous reverse blocking switch of claim 1.

13. A synchronous reverse blocking switch (SRBS) package for a soft-switching current source converter (SSCSC) comprising:
    SRBS modules;
    wherein each of the SRBS modules comprise the synchronous reverse blocking switch of claim 1.

14. The synchronous reverse blocking switch of claim 2, wherein a gate driver comprises the delay generation circuit.

15. The synchronous reverse blocking switch of claim 3, wherein the delay generation circuit is configured to delay a turn on control signal for the second controlled switch by the delay t_dON and delay a turn off control signal by the delay t_dOFF.

16. The synchronous reverse blocking switch of claim 3, wherein at least one of:
    the gate driver is configured to receive a single gate control signal from a main controller of a SSCSC to control the first controlled switch and the second controlled switch; or
    the gate driver is agnostic to a control scheme or modulation strategy of a SSCSC in which the synchronous reverse blocking switch is used.

17. The synchronous reverse blocking switch of claim 6, wherein the gate driver further comprises a fault protection circuit configured to force a turn OFF/deactivation of the second controlled switch in response to the sensing circuit indicating that the voltage across the second controlled switch exceeds a threshold value.

18. The synchronous reverse blocking switch of claim 11, wherein at least one of:
- individual control of the first controlled switch and the second controlled switch is not implemented by a controller of the SSCSC in which the synchronous reverse blocking switch is used;
- t_dOFF is less than a minimum time-to-resonance of a SSCSC bridge in which the synchronous reverse blocking switch is used;
- the first controlled switch and the second controlled switch are different types of controlled switches;
- the second controlled switch is connected in series to the first controlled switch via respective reference pins;
- the first controlled switch and the second controlled switch are connected in series with opposite current blocking orientations;
- the first controlled switch and the second controlled switch are oriented to block current in a direction towards the series connection; or
- the delay generation circuit is configured to control the second controlled switch to turn on after t_dON from the first controlled switch turning on and the second controlled switch to turn off after t_dOFF from the first controlled switch turning off by:
  - receiving control signals for the first controlled switch;
  - delaying the control signals; and
  - sending the delayed control signals to the second controlled switch.

19. A soft-switching current source converter (SSCSC) comprising:
- a first SSCSC bridge comprising at least one leg with two synchronous reverse blocking switches connected in series, the synchronous reverse blocking switches comprising:
  - a first controlled switch;
  - a second controlled switch connected in series to the first controlled switch; and
  - a delay generation circuit configured to control:
    - the second controlled switch to turn on after a delay (t_dON) from the first controlled switch turning on,
    - the second controlled switch to turn off after a delay (t_dOFF) from the first controlled switch turning off; and
    - the first and second controlled switches such that both are simultaneously on during an overlap duration;
- a second SSCSC bridge; and
- inductive element connected between the first and second SSCSC bridges;
- wherein the SSCSC is configured such that at least one of:
  - current generated by the SSCSC can flow through the second controlled switch of at least the first SSCSC bridge without active control of the respective second controlled switch; or
  - current in the inductive element does not reverse polarity under normal operating conditions of the SSCSC.

20. The SSCSC of claim 19, further comprising a gate driver having a sensing circuit configured to measure a voltage across the second controlled switch.

21. The SSCSC of claim 20, wherein at least one of:
- the inductive element comprises at least one from among a high-frequency transformer, series inductor, or a shunt inductor;
- t_dON is a predetermined duration;
- t_dON is a fixed duration;
- t_dOFF is a predetermined duration;
- t_dOFF is a fixed duration;
- the first SSCSC bridge further comprises the gate driver;
- the first SSCSC bridge further comprises the gate driver that further comprises the delay generation circuit;
- the delay generation circuit is configured to delay a turn on control signal for the second controlled switch by the delay t_dON and delay a turn off control signal by the delay t_dOFF;
- the first SSCSC bridge further comprises the gate driver that is configured to transmit a single activation signal and a single deactivation signal to control both the first controlled switch and second controlled switch, the delay generation circuit being between the second controlled switch and the gate driver, and the delay generation circuit controlling the second controlled switch to turn on after the delay t_dON and to turn off after the delay t_dOFF;
- the delay generation circuit comprises a passive delay circuitry;
- the delay generation circuit comprises a passive delay circuitry that is integrated within a package including the first and second controlled switches and with a single gate control interface configured to externally control both the first and second controlled switches;
- the SSCSC further comprises a fault protection circuit configured to prevent a turn ON/activation of the second controlled switch in response to the sensing circuit indicating that the voltage across the second controlled switch is positive, the voltage across the second controlled switch being measured such that the voltage is positive when the second controlled switch blocks a current;
- at least one of the first controlled switch and the second controlled switch is a silicon switch;
- at least one of the first controlled switch and the second controlled switch comprises a silicon carbide or gallium nitride switch;
- at least one of the first controlled switch and the second controlled switch is a metal-oxide-semiconductor field-effect transistor (MOSFET);
- at least one of the first controlled switch and the second controlled switch is a high-electron-mobility transistor (HEMT); or
- at least one of the first controlled switch and the second controlled switch is an insulated gate bipolar transistor (IGBT).

* * * * *